(12) United States Patent
Loh

(10) Patent No.: US 6,717,820 B1
(45) Date of Patent: Apr. 6, 2004

(54) CIRCUIT BOARD ASSEMBLY

(75) Inventor: Kah Phang Loh, Singapore (SG)

(73) Assignee: Agilent Technologies, Inc., Palo Alto, CA (US)

( * ) Notice: Subject to any disclaimer, the term of this patent is extended or adjusted under 35 U.S.C. 154(b) by 44 days.

(21) Appl. No.: 09/585,261

(22) Filed: Jun. 2, 2000

(30) Foreign Application Priority Data

Feb. 22, 2000 (SG) .............................. 20000573

(51) Int. Cl.[7] .............................. H05K 7/02; H05K 7/06; H05K 7/08; H05K 7/10
(52) U.S. Cl. .................................. 361/760; 361/761
(58) Field of Search ........................... 361/760–761, 361/764, 767, 768, 737, 736, 725–730; 385/90–92; 257/81–82, 666, 681–684, 99

(56) References Cited

U.S. PATENT DOCUMENTS

| 5,506,445 | A | | 4/1996 | Rosenberg | ................... 257/666 |
| 5,977,567 | A | * | 11/1999 | Verdiell | ....................... 257/99 |
| 6,023,414 | A | * | 2/2000 | Fujii | ........................ 361/761 |
| 6,188,132 | B1 | * | 2/2001 | Shih et al. | .................. 257/724 |
| 6,252,252 | B1 | * | 6/2001 | Kunii et al. | ................... 257/81 |

* cited by examiner

*Primary Examiner*—Kamand Cuneo
*Assistant Examiner*—Tuan Dinh

(57) ABSTRACT

A circuit board assembly comprising a circuit board with a recessed end portion, and an optical transceiver module mounted on a daughter board. The daughter board is mounted on the circuit board so that a portion of the daughter board extends over the recess of the circuit board. The optical transceiver module mounted on the daughter board is then positioned in the recess of the circuit board.

18 Claims, 9 Drawing Sheets

CIRCUIT BOARD ASSEMBLY

This invention relates generally to circuit board assemblies. In particular, the invention relates to assemblies of circuit boards and optical transceiver modules.

BACKGROUND OF THE INVENTION

Infrared transceivers modules are often incorporated into electronic devices to enable bi-directional wireless communication with other electronic devices. For example, it is known for a portable digital assistant (PDA) to communicate with a laptop computer, a printer, or another PDA via a standard Infrared Data Association (IrDA) link. Similarly, IR transceivers are becoming increasingly popular for use in hand-portable telephones, enabling telephone users to swap stored numbers, play wirelessly-linked games, or wirelessly link their telephones to IR-enabled accessories.

The advantages of using an IR link over standard electrical connectors are numerous and well documented. These advantages include: 1) greater alignment tolerance; 2) the ability to hermetically seal the data interface; 3) no cables susceptible to RF interference; and 4) no electro-magnetic compatibility (EMC) issues.

An IR transceiver module typically comprises a light emitting diode (LED) and a photodiode, packaged together with appropriate supporting circuitry to form a self-contained unit. Electrical terminals are exposed on the outside of the package to enable the module to be electrically coupled to external circuitry.

By combining the various components of an IR transceiver into a single package or module, the size or form-factor of the transceiver system can be considerably reduced. Furthermore, the modules tend to be more durable and often consume less power than equivalent transceivers consisting of discrete components.

When an IR link or communication channel is created between two IR transceiver modules, the LED in the first transceiver optically couples with the photodiode in the second transceiver, and the LED in the second transceiver optically couples with the photodiode in the first transceiver. Although the transceivers typically operate in the infrared optical frequency band it is equally possible for other optical frequency bands to be used in forming the communication channel.

FIG. 1 shows a prior art hand-portable telephone 100, such as the Model 6110 cellular telephone available from Nokia Mobile Phones Oy, Finland, which incorporates a known IR transceiver module (not shown). The telephone includes a standard keypad 110, a display 120, and an antenna 130. The telephone housing 140 encloses circuitry including a IR transceiver module positioned adjacent an IR transparent window 150. The window is transparent to IR radiation enabling the IR transceiver module to communicate optically with other devices outside the housing 140.

FIG. 2 is a more detailed view of the internal circuitry of the hand-portable telephone of FIG. 1, showing the IR transceiver module 200 mounted on an end portion of a main printed circuit board (PCB) 250. The transceiver module 200 is formed with a first molded lens shape 210 over the LED and a second molded lens shape 220 over the photodiode. Leads 230 provide mounting supports and electrical interconnections between the IR transceiver 200 and the printed circuit board 250. A typical length "L" for the IR transceiver body is approximately 10 mm, a typical depth "D" is 5 mm, and a typical height "H" is 4 mm. A typical thickness "T" for the printed circuit board 250 is 1 mm.

Consumer pressure is driving electronic device manufacturers such as radio telephone manufacturers to produce ever slimmer products. One way to help reduce the thickness of these products is to minimising the thickness of printed circuit boards contained in the products. Components mounted on the printed circuit boards contribute to the overall circuit board thickness. Therefore, by reducing the height of components on the circuit board, the circuit board thickness may be reduced which in turn can enable slimmer products to be manufactured. Excessive height above a circuit board can thus be a problem for components.

One solution for reducing the height of components on a circuit board is to simply use smaller components. Components are now available which when mounted directly on a circuit board stand less than 1 mm from the board surface. However, for components with optical lenses such as infrared transceiver modules, the module height is limited by the diameter of the lens. The lenses must be of a minimum size to ensure adequate performance of the IR transceiver and to satisfy legislated eye safety requirements (lenses smaller than the minimum size can concentrate light emitted from the transceiver to dangerous levels). Some manufacturers have overcome the lens size limitation by cutting off small portions from each lens. This approach again leads to a degradation in the performance of the IR transceiver. The smallest IR transceiver module currently available has a height of 2.5 mm.

Another solution for reducing the height of components on a circuit board is disclosed in U.S. Pat. No. 5,506,445, assigned to Hewlett-Packard Company, USA. FIGS. 3 and 4 illustrate this solution which involves mounting a leadframe IR transceiver adjacent an end surface of a printed circuit board by means of a series of shaped leads 230. An alternative lead arrangement adopted by one manufacturer, Vishay Company, USA, is shown in FIG. 5. This solution has drawbacks. Firstly, the leads on these packages need to be long enough to enable them to correctly attach to the circuit board. However, long leads cause co-planarity problems which in turn causes a high percentage of products to fail during manufacture. Secondly, the complex arrangement of the leads makes lead trimming difficult and expensive to achieve during manufacture. Thirdly, the lack of a surface on which the IR transceiver body is supported results in an inherently unstable device assembly. Alternating motion stresses are concentrated directly on the solder joints coupling the IR transceiver module to the printed circuit board. An additional problem which the applicant has found In practice is that the IR transceiver does not lend itself to automated assembly. The complex alignment and a lack of pick and place surface mean that manual assembly is necessary for this type of product.

The foregoing illustrates that there is need for a low profile optical transceiver which overcomes the drawbacks associated with the prior art.

SUMMARY OF THE INVENTION

The present invention provides a system for assembling a circuit board and an optical transceiver module, in which the optical transceiver module is mounted onto an additional substrate. The additional substrate allows the optical transceiver module to be placed within an open slot of the main circuit board, thus reducing the effective height of the module from the circuit board surface. Suitably, the additional substrate provides electrical interconnections between the optical transceiver module and the circuit board.

According to a first aspect, the present invention provides a circuit board assembly comprising; a planar circuit board having a major surface and a side surface, a planar substrate mounted on the major surface of the circuit board, an extended portion of the planar substrate extending beyond the side surface, and an optical transceiver module mounted on the extended portion of the substrate adjacent the side surface of the printed circuit board.

According to a second aspect, the present invention provides a circuit board assembly comprising; a planar circuit board having a major surface, and a side surface defining a recess, a planar substrate mounted on the major surface of the circuit board, an extended portion of the planar substrate extending over the recess, and an optical transceiver module mounted on the extended portion of the substrate so as to be disposed in the recess.

According to a third aspect, the present invention provides an optical transceiver module package for mounting on a planar circuit board having a major surface and a side surface, the major surface provided with electrical terminals, the optical transceiver module package comprising: a planar substrate for mounting on the major surface of the circuit board so that an extended portion of the planar substrate extends beyond the side surface, an optical transceiver module provided with electrical terminals and mounted on the extended portion of the substrate adjacent the side surface of the printed circuit board, and electrically conductive interconnects associated with the planar substrate for coupling the electrical terminals on the optical transceiver module with electrical terminals on the planar circuit board.

According to a fourth aspect, the present invention provides an optical transceiver module package for mounting on a planar circuit board having a major surface and at least one side surface defining a recess, the major surface provided with electrical terminals, the optical transceiver module package comprising: a planar substrate for mounting on the major surface of the circuit board so that an extended portion of the planar substrate extends over the recess, and an optical transceiver module provided with electrical terminals and mounted on the extended portion of the substrate so as to be disposed in the recess, and electrically conductive interconnects associated with the planar substrate for coupling the electrical terminals on the optical transceiver module with electrical terminals on the planar circuit board.

A circuit board assembly or optical transceiver module package in accordance with the invention has the advantage that the optical transceiver module is mounted on a planar substrate instead of the circuit board, which avoids the optical transceiver module protruding directly from the circuit board surface. Consequently, the effective height of the optical transceiver module can be reduced by at least the thickness of the circuit board, allowing the module to protrude or extend less from the from the circuit board surface. Thus, the overall thickness of the circuit board assembly can be reduced.

The optical transceiver module package which includes the planar substrate in accordance with the present invention also has the advantage that it can be assembled with the circuit board using a standard pick and place machine.

Suitably, the planar substrate provides a surface from which the pick and place machine can hold and manoeuver the optical transceiver module package.

In a preferred embodiment, the planar circuit board includes an end portion defining a recess in which the optical transceiver module is disposed In accordance with another aspect of the invention, a side surface of the circuit board may define the recess. This side surface may be a single continuous surface defining the recess or a multi-faceted surface made up of a two or more joined panels defining the recess.

Ideally, the planar substrate includes electrically conductive interconnects for coupling electrical terminals on the optical transceiver module with electrical terminals on the planar circuit board.

According to a fifth aspect, the present invention provides a method of manufacturing a circuit board assembly comprising: providing a planar substrate, mounting an optical transceiver module on a first portion of the planar substrate, and mounting a second portion of the planar substrate on a major surface of a circuit board such that the optical transceiver module is disposed adjacent a side surface of the planar circuit board.

A method in accordance with the invention has the advantage that it enables the optical transceiver module to be packaged together with the planar substrate for subsequent mounting on the planar circuit board, which in turn enables the optical transceiver module to be reliably packaged prior to mounting on the circuit board. The optical transceiver module package can be manufactured on a large scale, and each package can then be reliably mounted on the circuit board. Pick and place machines can be used advantageously to hold and manoeuver the optical transceiver module package during mounting on the circuit board.

In a preferred method in accordance with the invention, the planar substrate is separated from a relatively larger planar substrate using a singularising step.

Preferably, a multitude of planar substrates are singularised from the larger planar substrate, with each planar substrate including an optical transceiver module.

Embodiments of the invention will now be described, by way of example, with reference to the accompanying drawings, in which.

OPTICAL TRANSCEIVER MODULE PACKAGE

Figure 1:
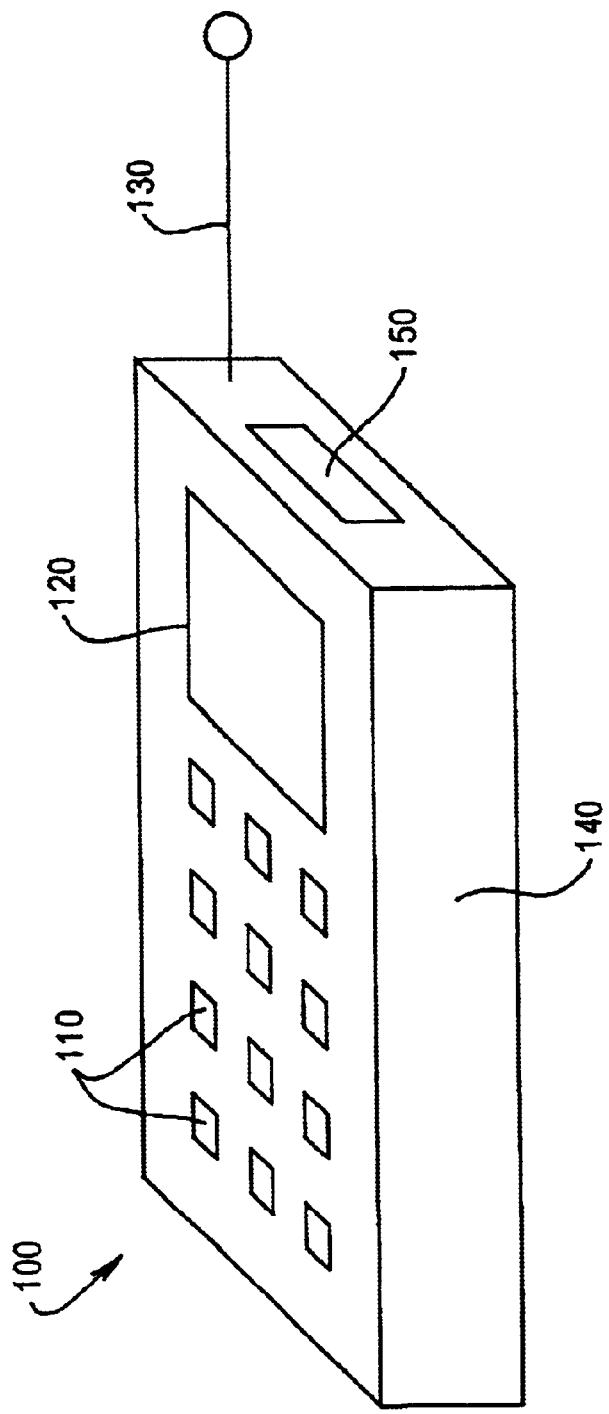
FIG. 1 is a perspective view of a prior art hand-portable telephone.
Figure 2:
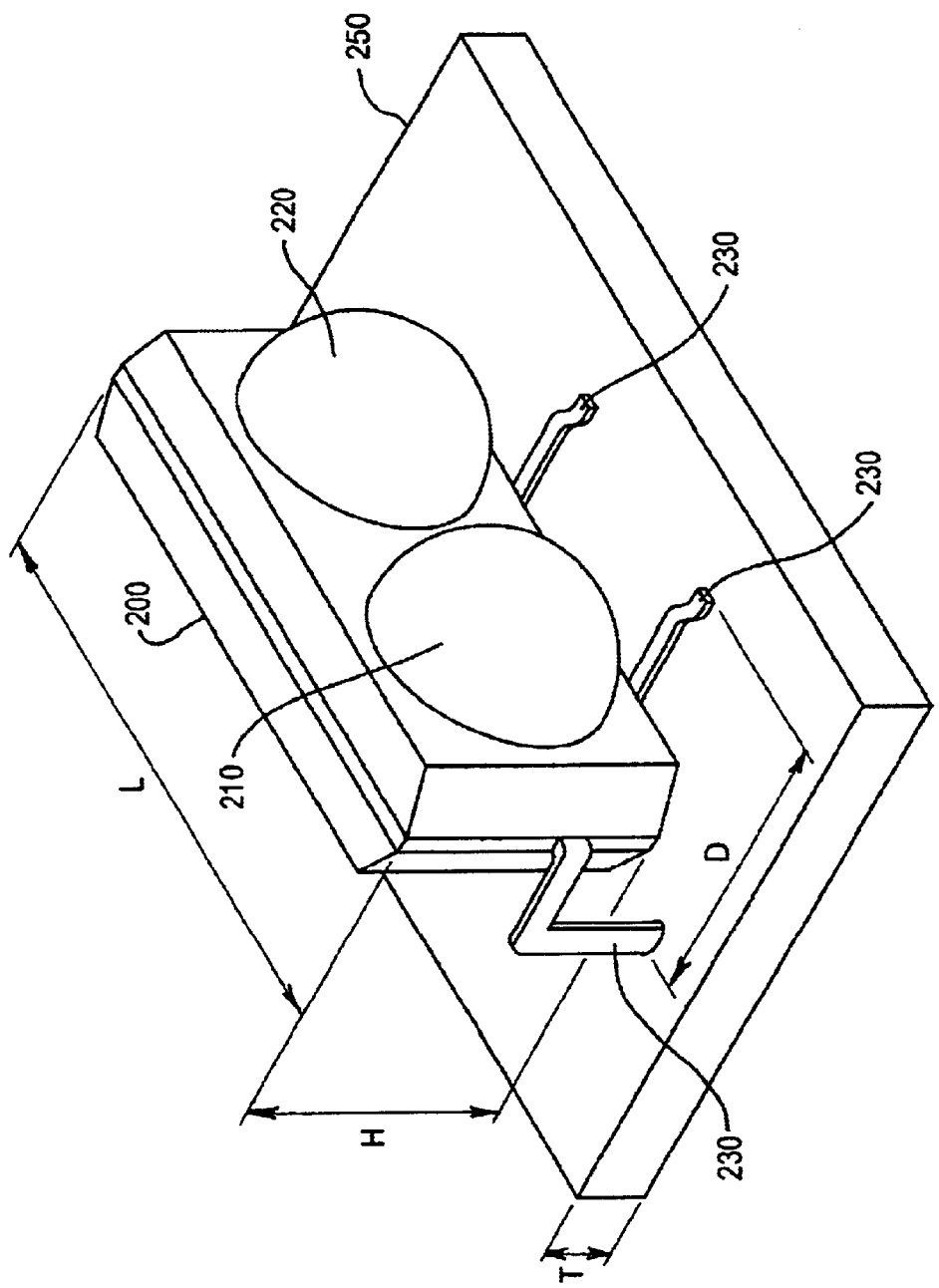
FIG. 2 is a perspective view of the internal circuitry of the hand-portable telephone of FIG. 1.
Figure 3:
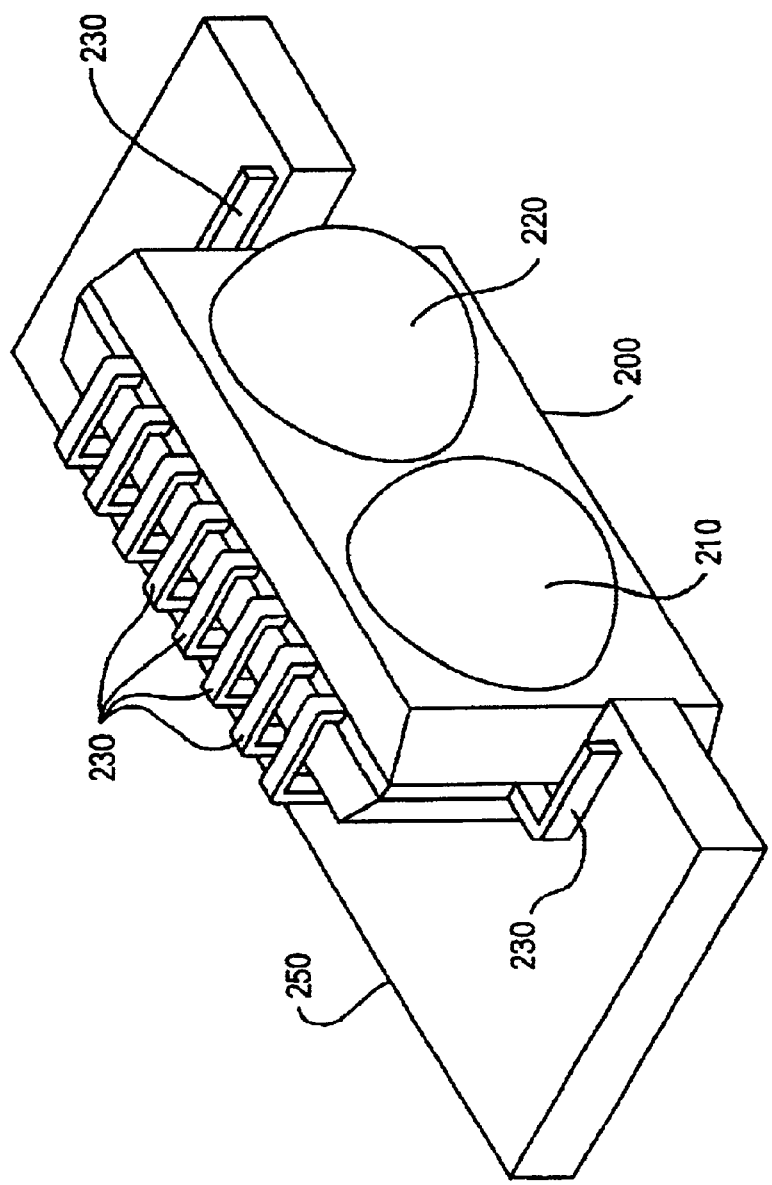
FIG. 3 is a perspective view of a prior art leadframe IR transceiver mounted adjacent an end surface of a printed circuit board.
Figure 4:
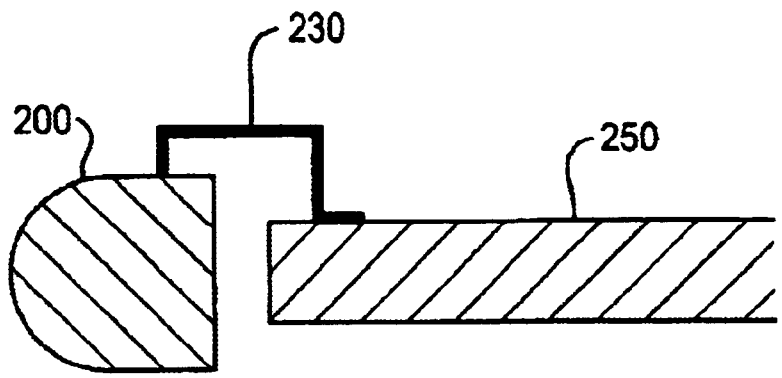
FIG. 4 is a cross-sectional side view of the transceiver of FIG. 3.
Figure 5:
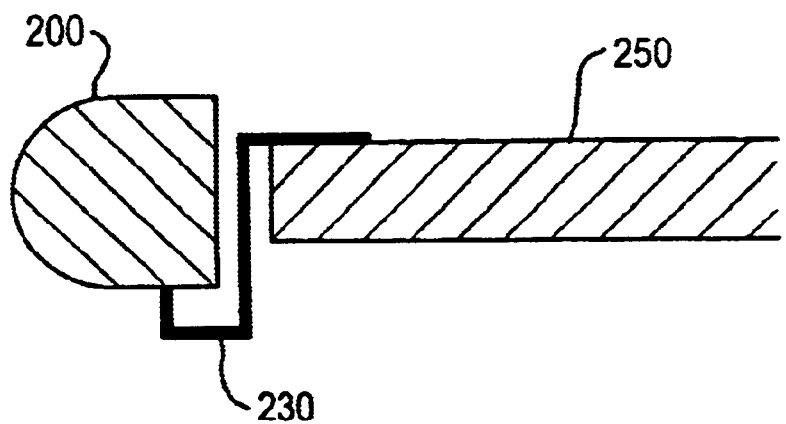
FIG. 5 is a cross-sectional side view of an IR transceiver similar to that of FIG. 3 with an alternative lead arrangement.
Figure 6:
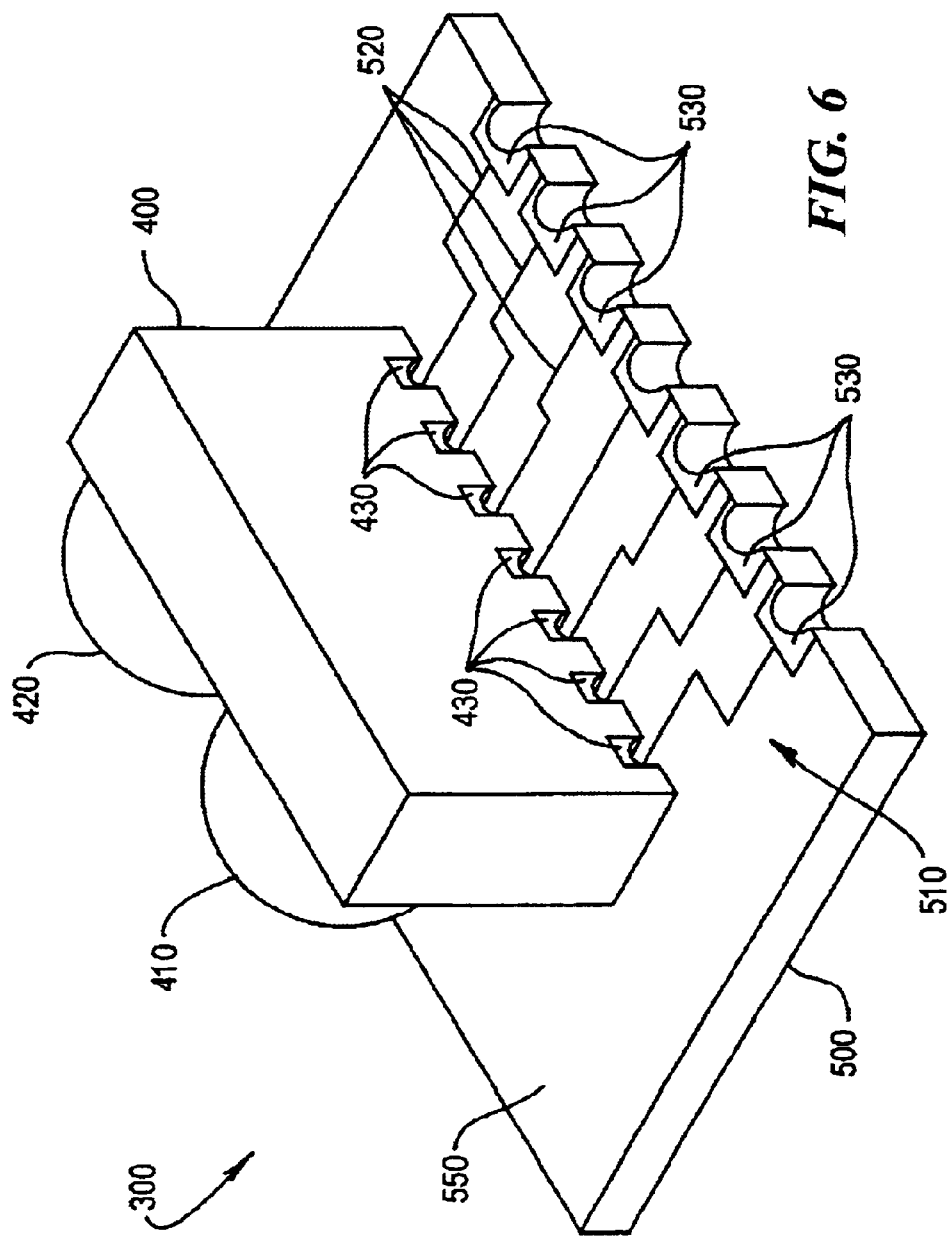
FIG. 6 is a perspective view of a optical transceiver module package in accordance with the invention.

Referring to FIG. 6, there is shown an optical transceiver module package 300 which can be mounted onto a main printed circuit board (PCB) of a portable telephone or any other suitable electronic apparatus to enable the apparatus to communicate optically with other electronic devices. The package 300 comprises an optical transceiver module 400 surface mounted on a planar substrate 500. The optical transceiver module 400 is preferably an infrared transceiver module, such as the HSDL-3201 model infrared transceiver available from Agilent Technologies Inc., USA. The planar substrate can be rigid or flexible with a thickness preferably less than that of a standard circuit board.

The optical transceiver module 400 is formed with a first molded lens shape 410 over a light emitting diode (LED) and a second molded lens shape 420 over a photodiode. A series of electrical terminals 430 provide mounting supports and electrical interconnections between the optical transceiver module 400 and the planar substrate 500. Each electrical terminal 430 consists of metallic plated area on the outer surface optical transceiver module 400. The plated area includes a curved surface defining a semi-cylindrical void or arch over the planar substrate 500. Curved surface terminals of this kind are often referred to as castellated terminals.

The optical transceiver module 400 is surface mounted onto a major surface 550 of the planar substrate 500 using a standard reflow solder bond technique. This technique involves depositing portions of solder paste at predefined positions on the planar substrate. The optical transceiver module 400 is then positioned onto the planar substrate such that the terminals 430 align with the solder paste portions. The tackiness of the solder paste ensures that the transceiver module remains in position on the substrate. The solder paste portions are then heated until they melt and flow over the metallic terminals 430 forming a series of reflowed solder bonds or joints 440 (shown in FIG. 10A).

The major surface 550 of planar substrate also includes electrically conductive interconnects 510 for coupling the electrical terminals 430 on the optical transceiver module to a printed circuit board on which the optical transceiver module package 300 is mounted. Each interconnect 510 is associated with a terminal 430 of the optical transceiver module, and comprises an electrically conductive terminal 530 and a conductive trace 520. The conductive trace 520 is connected at one end to the electrically conductive terminal 530 and at the other end to the solder bond 440 that attaches the terminals 430 of the optical transceiver module to the substrate 500. As shown in FIG. 6, the conductive traces extend beneath the arched surfaces of the terminals 430 and, in a preferred embodiment, form enlarged tabs to which the solder can securely bond. The conductive terminals 530 are castellated terminals similar to the castellated terminals 430 of the optical transceiver module.

Figure 7:
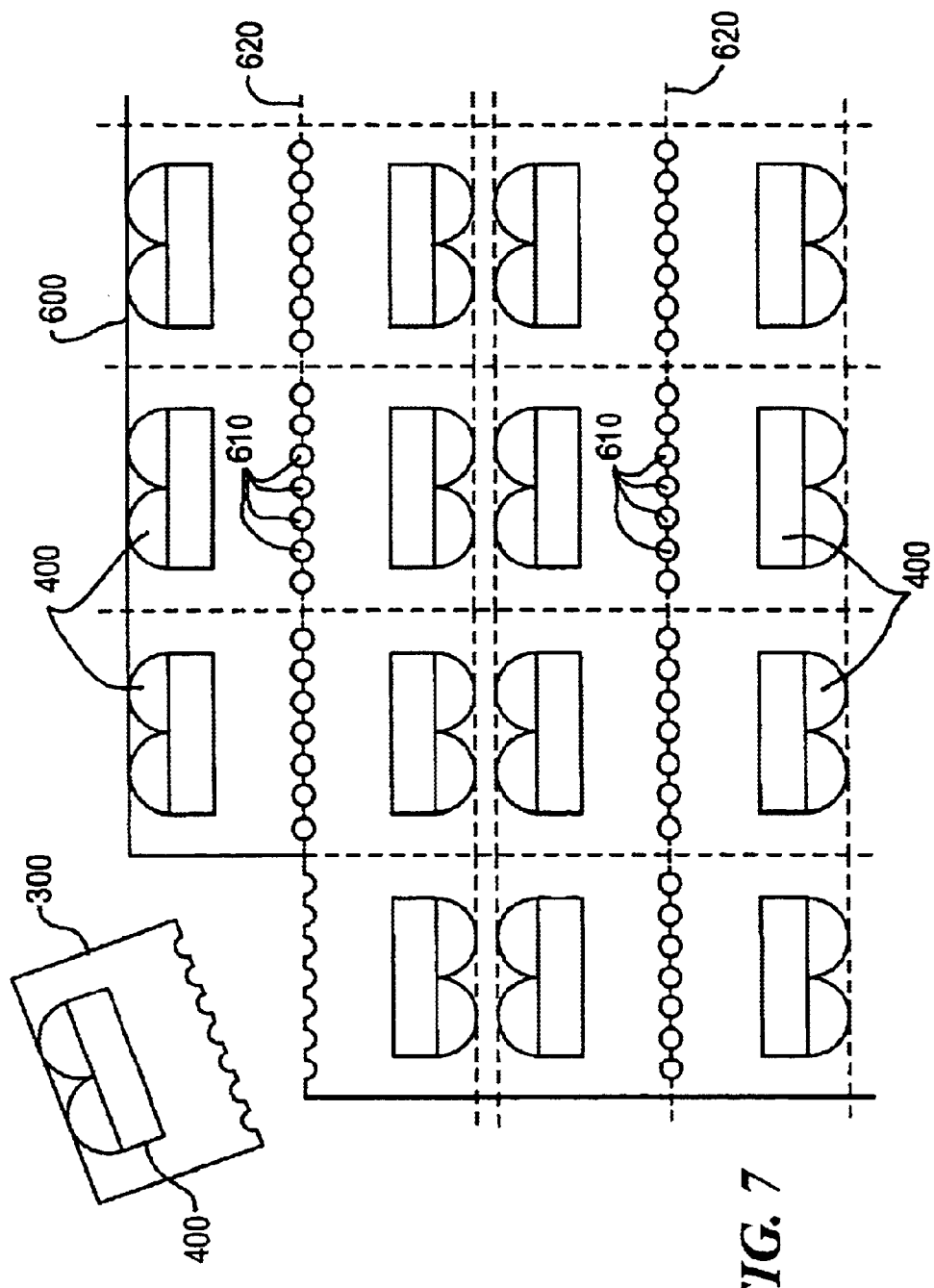
FIG. 7 is a plan view of a large planar substrate from which multiple optical transceiver module packages may be singularised.

FIG. 7 illustrates how the optical transceiver module package 300 can be manufactured in large quantities from a larger substrate 600. The manufacturing process involves the following steps:

1) Providing a large planar substrate 600;
2) Drilling a plurality of through-holes 610 along a series of spaced apart rows 620 on the substrate 600;
3) Mounting optical transceiver modules 400 on the planar substrate in positions either side of the rows of holes 620; and
4) Cutting the planar substrate along predetermined cut lines (see dashed lines in FIG. 7), including cutting through the middle of the rows 620 of drilled holes, in order to separate the substrate 600 into a plurality of optical transceiver module packages 300 with each package containing a single optical transceiver module 400.

The step of separating the planar substrate into a plurality of optical transceiver module packages 300 may be referred to generally as a singularising step. The process of singularising is a technique familiar to those skilled in the art.

The drilling step creates cylindrically shaped holes 610 in the substrate 600 that are cut in the singularising step so as to create two sets of semi-cylindrically shaped recesses along the cut sides of the substrate 600. These recesses form the basis of the castellated terminals 530 in the optical transceiver module package 300 (see also FIG. 6).

Typically, the optical transceiver module package 300 will be manufactured in large quantities and supplied to circuit board assemblers such as portable telephone manufacturers on carrier tape.

CIRCUIT BOARD ASSEMBLY

Figure 8:
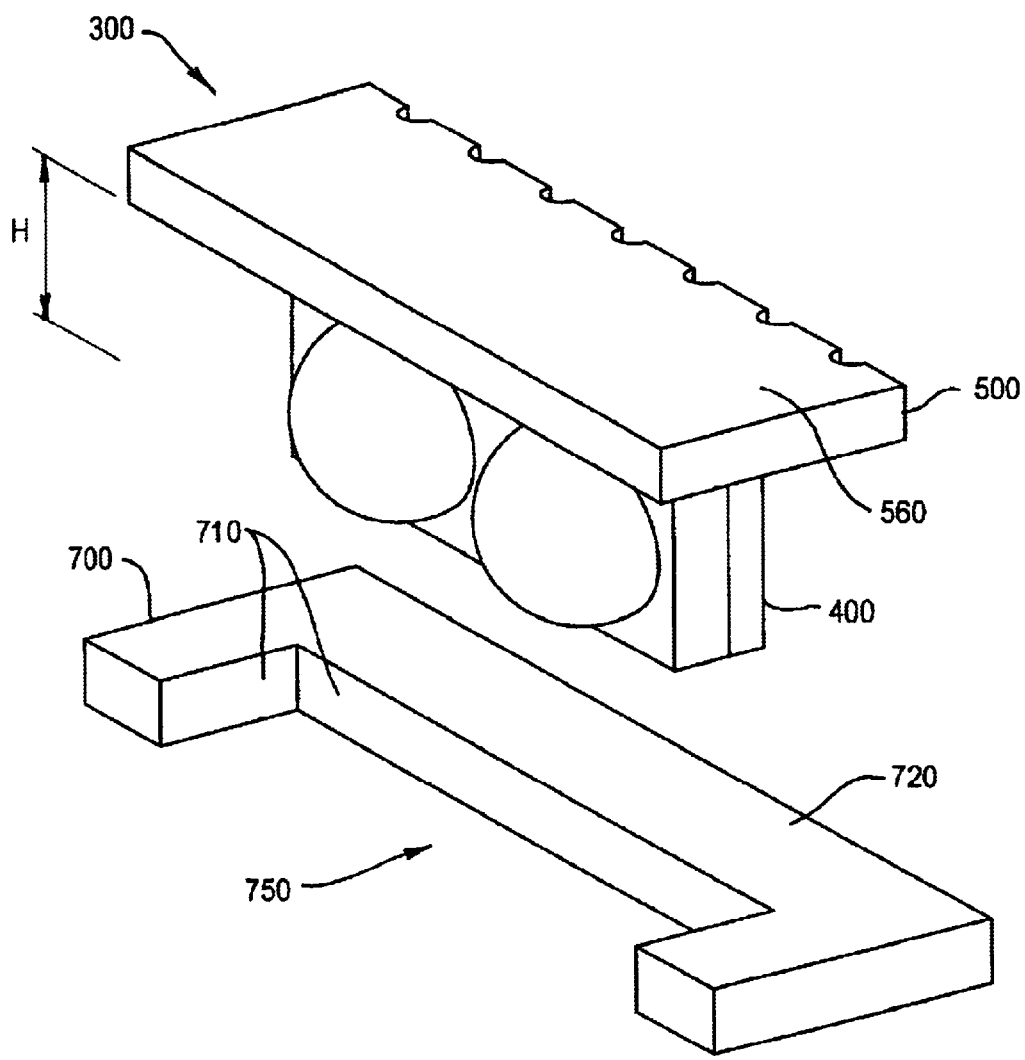
FIG. 8 is a perspective view of the optical transceiver module package of FIG. 6 prior to assembly on an end portion of a circuit board.

Referring to FIG. 8, when it is desired to assemble the optical transceiver module package 300 onto a circuit board 700 of, for example, a portable telephone, the package 300 can be removed from the carrier tape using a pick and place machine. By taking advantage of the relatively large major surface 560 of the substrate 500 (opposite the transceiver mounting surface 550), the package 300 can be picked with relative ease and moved to the pre-assembly position shown in FIG. 8. In this position, the optical transceiver module depends from the planar substrate towards a modified end portion of the circuit board 700. The circuit board 700 is modified so as to form a slot or recess 750 which is bounded by a side surface 710 of the board on three side leaving a fourth side open.

Figure 9:
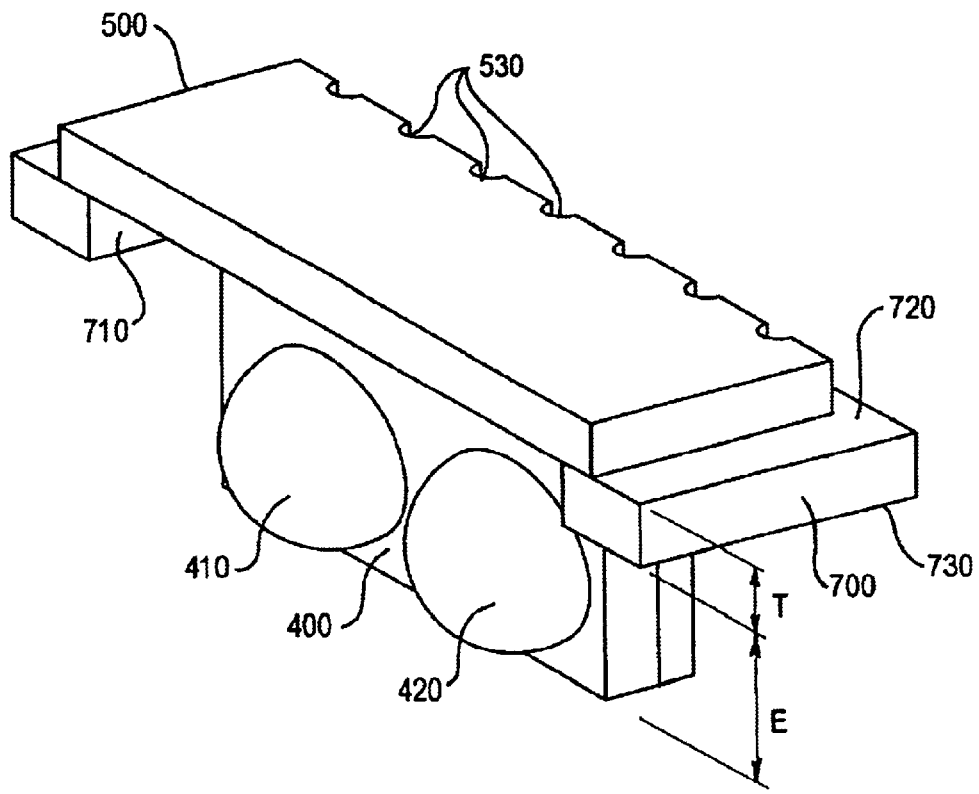
FIG. 9 is a perspective view similar to FIG. 8 with the optical transceiver module package assembled with the circuit board.
Figure 10A:
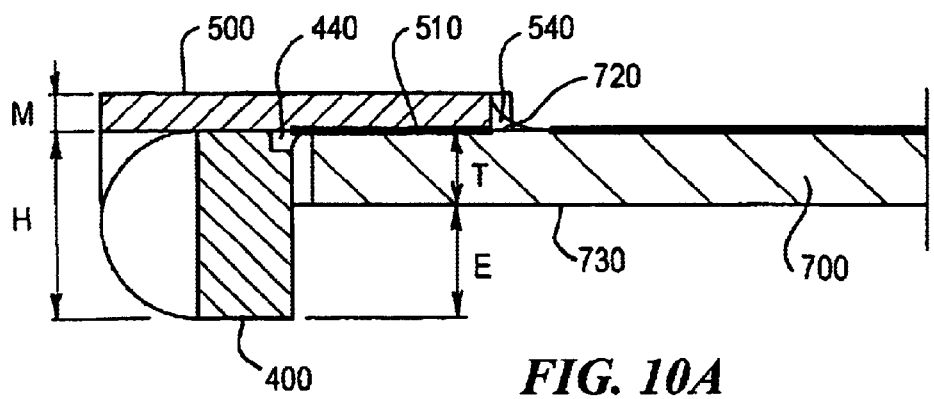
FIG. 10A is a side cross-sectional view of the circuit board assembly of FIG. 9.
Figure 10B:
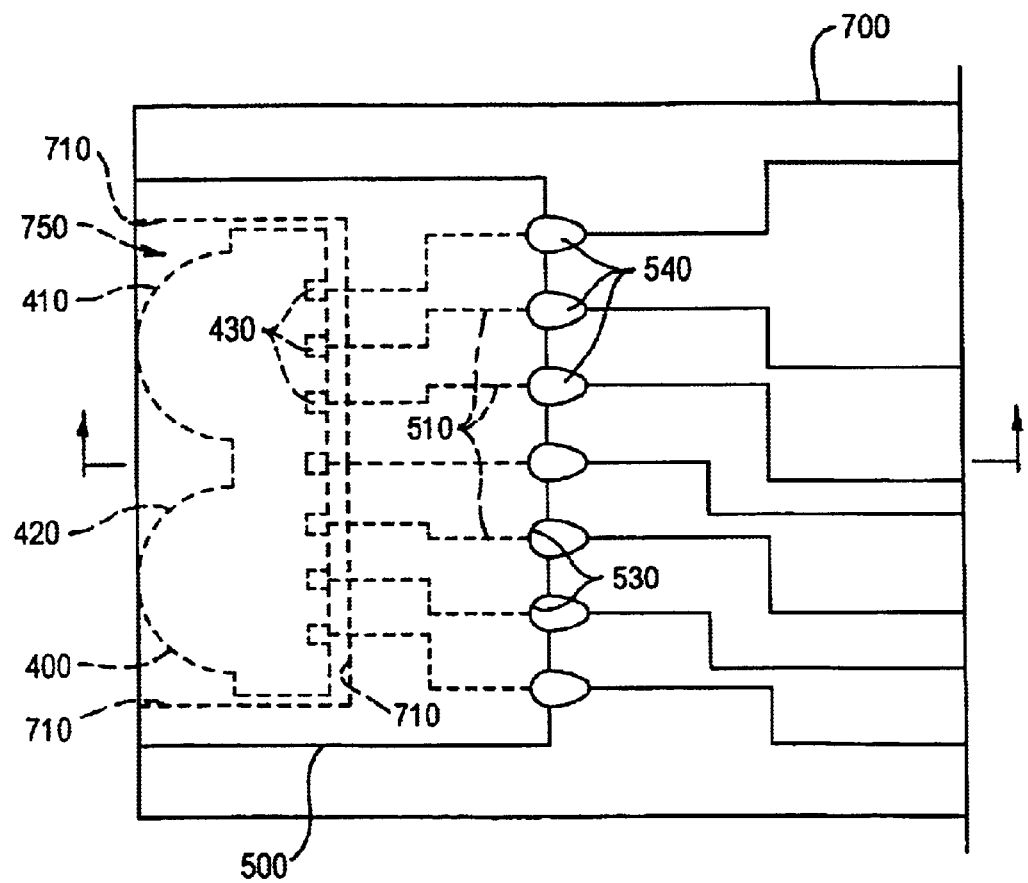
FIG. 10B is a plan view of the printed circuit board assembly of FIG. 9.

Referring also to FIGS. 9, 10A and 10B, final assembly of the circuit board involves lowering the substrate 500 of the optical transceiver module package 300 onto a major surface 720 of the circuit board and soldering the terminals 530 of the substrate 500 to the major surface 720. In this assembled position, the optical transceiver module 400 is situated in the recess 750 of the circuit board adjacerit the side surface 710 of the circuft board, with the transceiver lenses 410, 420 facing outwards from the fourth open side of the recess 750. Also in this assembled position the planar substrate 500 lies parallel with the circuit board 700, with the optical transceiver module 400 and the circuit board 700 adjacent the same major surface 550 of the substrate. Furthermore, the portion of the substrate 500 that supports the transceiver module 400 extends beyond the side surface 710 of the circuit board 700 and covers the recess 750.

The terminals 530 of the planar substrate 500 are soldered to the major surface 720 of the circuit board using the standard reflow solder bond technique referred to earlier. Again, this technique involves depositing portions of solder paste at predefined positions on the circuit board surface 720. The planar substrate 500 is then positioned onto the circuit board such that the terminals 530 align with the solder paste portions. The tackiness of the solder paste ensures that the planar substrate 500 remains in position on the circuit board. The solder paste portions are then heated until they melt and flow over the metallic terminals 530 forming a series of reflowed solder bonds or joints 540 (shown in FIG. 10A). Suitably, the solder joints 540 electrically couple the interconnects 510 on the planar substrate 500 to appropriate conductive terminals and traces on the circuit board so that the optical transceiver can function correctly.

A particular advantage associated with the circuit board assembly of FIG. 9, 10A and 10B is the amount by which the optical transceiver module extends from the circuit board surface. A typical prior art optical transceiver module attached directly to a circuit board would extend by the height of the module H. However, in the present circuit board assembly, the optical transceiver module lies in a recess 750 of the circuit board and only extends from the circuit board surface 730 by an amount E equal to the difference between the absolute height of the module H and the thickness of the circuit board T. Thus, the effective height of the optical transceiver module is reduced relative to the prior art by the thickness of the circuit board T. Typically, the transceiver module will have a height dimension H of between 2.5 mm and 4 mm, and the circuit board thickness will be approximately 1 mm. The effective height of the transceiver module can therefore be reduced by approximately 25 to 40 percent.

A minor drawback with this assembly is that the substrate 500 extends from an opposite surface 720 of the circuit board by an amount equal to the thickness of the substrate M. To counter this drawback, the thickness of the substrate 500 can be minimized to a thickness of, for example, 0.2 to 0.5 mm. However, in most circuit board assemblies, such as those used in portable telephones, components of up to 1 mm in height are mounted on both sides of the board. Accordingly, the height of the substrate from the surface 720 will generally not exceed that of the components and will not therefore be a drawback.

Surface mounting is used extensively in the present embodiment to assemble the circuit board and optical transceiver module. Surface mount technology (SMT) is both fast and accurate during production and provides reliable and durable connections post-production. The use of this technology therefore provides additional advantages over prior art devices which use other technologies, such as leadframe packaging. Leadframe packages are more susceptible to co-planarity problems during circuit board assembly and tend to fail when subject to harsh physical shocks often applied by users of portable electronic equipment.

It will be evident in view of the foregoing that various modifications may be made within the scope of the present invention. For example, the optical transceiver module and the planar substrate may be mounted using leaded pin, ball grid array, or any other suitable mounting technology. Furthermore, the optical transceiver module package may be mounted on a side portion rather than recessed end portion of a circuit board.

I claim:

1. A circuit board assembly comprising:
   a planar circuit board having a major surface and a side surface,
   a planar substrate mounted on the major surface of the circuit board, an extended portion of the planar substrate extending beyond the side surface said planar circuit board, and
   an optical transceiver module mounted on the extended portion of the substrate adjacent the side surface of the printed circuit board, a functional front of the optical transceiver module generally perpendicular to the major surface and facing away from the planar circuit board, light being transmittable and receivable through the functional front.

2. An assembly as claimed in claim 1, wherein the planar circuit board includes an end portion defining a recess in which the optical transceiver module is disposed.

3. An assembly as claimed in claim 1, wherein the planar substrate includes electrically conductive interconnects for coupling electrical terminals on the optical transceiver-module with electrical terminals on the planar circuit board.

4. An assembly as claimed in claim 1, wherein the planar substrate and the planar circuit board are substantially parallel.

5. An assembly as claimed in claim 1, wherein the planar substrate is soldered onto the major surface of the planar circuit board.

6. An assembly as claimed in claim 1, wherein the optical transceiver module is soldered onto the extended portion of the planar substrate.

7. An assembly as claimed in claim 1, wherein the optical transceiver module is mounted on, and the major surface of the planar circuit board faces a same side of the planar substrate.

8. An assembly as claimed in claim 1, wherein the optical transceiver module comprises a light emitting diode and a photodiode, packaged together with supporting circuitry to form a self-contained unit.

9. An assembly as claimed in claim 1, wherein the optical transceiver module is surface mounted on the extended portion of the substrate.

10. An assembly as claimed in claim 1, wherein the optical transceiver module-further comprises lenses having apexes that define the functional front of the optical transceiver module and wherein the extended portion of the planar substrate has an edge that is substantially planar with the apexes.

11. An assembly as claimed in claim 1, wherein the optical transceiver module further compries castellated electrical terminals defined at an edge of the optical transceiver module and the planar substrate comprises electrically conductive interconnects; wherein the castellated electrical terminals are electrically connected to the electrically conductive interconnects by solder joints.

12. An assembly as claimed in claim 8, wherein the optical receiver module comprises a first molded lens shape over the light emitting diode and a second molded lens shape over the photodiode.

13. An assembly as claimed in claim 8, wherein the optical transceiver module is an infrared transceiver module.

14. An assembly as claimed in claim 2, wherein the side surface of the planar circuit board is a multi-faceted surface bounding the recess on three sides and leaving a fourth side open.

15. An assembly as claimed in claim 14, wherein the optical transceiver module comprises a plurality of transceiver lenses which face outwards from the open side of the recess.

16. A circuit board assembly comprising:
   a planar circuit board having a major surface, and a side surface defining a recess,
   a planar substrate mounted on the major surface of the circuit board, an extended portion of the planar substrate extending over the recess, and
   an optical transceiver module having a functional front through which light is transmittable and receivable, the optical transceiver module being mounted on the extended portion of the substrate so as to be disposed in the recess with the functional front generally perpendicular to the major surface of the planar circuit board and facing away from the planar circuit board.

17. An optical transceiver module package for mounting on a planar circuit board having a major surface and a side surface, the major surface provided with electrical terminals, the optical transceiver module package comprising:
   a planar substrate for mounting on the major surface of the circuit board so that an extended portion of the planar substrate extends beyond the side surface, an optical transceiver module provided with electrical terminals and a functional front through which light is transmittable and receivable, the optical transceiver module being mounted on the extended portion of the substrate adjacent the side surface of the printed circuit board such that the functional front is generally perpendicular to the major surface of the planar circuit board and faces away from the planar circuit board, and electrically conductive interconnects associated with the planar substrate for coupling the electrical terminals on the optical transceiver module with electrical terminals on the planar circuit board.

18. An optical transceiver module package for mounting on a planar circuit board having a major surface and at least one side surface defining a recess, the major surface provided with electrical terminals, the optical transceiver module package comprising:

a planar substrate for mounting on the major surface of the circuit board so that an extended portion of the planar surface extends over the recess, an optical transceiver module provided with electrical terminals and a functional front through which light is transmittable and receivable, the optical transceiver module being mounted on the extended portion of the substrate so as to be disposed in the recess with the functional front generally perpendicular to the major surface of the planar circuit board and facing away from the planar circuit board, and electrically conductive interconnects associated with the planar substrate for coupling the electrical terminals on the optical transceiver module with electrical terminals on the planar circuit board.

* * * * *